(12) United States Patent
Zhou et al.

(10) Patent No.: US 11,211,530 B2
(45) Date of Patent: Dec. 28, 2021

(54) LIGHT SOURCE AND ILLUMINATION DEVICE INCLUDING THE LIGHT SOURCE

(71) Applicants: OPPLE LIGHTING CO., LTD., Shanghai (CN); SUZHOU OPPLE LIGHTING CO., LTD., Suzhou (CN)

(72) Inventors: Zhixian Zhou, Shanghai (CN); Jie Qiang, Shanghai (CN)

(73) Assignees: Opple Lighting Co., Ltd., Shanghai (CN); Suzhou Opple Lighting Co., Ltd., Suzhou (CN)

( * ) Notice: Subject to any disclaimer, the term of this patent is extended or adjusted under 35 U.S.C. 154(b) by 143 days.

(21) Appl. No.: 16/594,860

(22) Filed: Oct. 7, 2019

(65) Prior Publication Data

US 2020/0083410 A1    Mar. 12, 2020

Related U.S. Application Data

(63) Continuation of application No. PCT/CN2018/081970, filed on Apr. 4, 2018.

(30) Foreign Application Priority Data

Apr. 7, 2017  (CN) .......................... 201710222549.9
Apr. 7, 2017  (CN) .......................... 201720356377.X
(Continued)

(51) Int. Cl.
*H01L 33/50*         (2010.01)
*F21V 23/00*         (2015.01)
(Continued)

(52) U.S. Cl.
CPC .......... *H01L 33/504* (2013.01); *F21V 23/003* (2013.01); *F21V 23/02* (2013.01);
(Continued)

(58) Field of Classification Search
CPC ........ F21V 23/003; F21V 23/02; F21V 29/70; F21V 9/30; F21V 23/00; H01L 33/504; H01L 33/507; F21Y 2115/10; F21K 9/64
See application file for complete search history.

(56) References Cited

U.S. PATENT DOCUMENTS

2008/0180948 A1 * 7/2008  Yoon .................. C09K 11/7728
                                                       362/230
2008/0203900 A1    8/2008  Chen et al.
(Continued)

FOREIGN PATENT DOCUMENTS

CN      101257014 A      9/2008
CN      102290521 A     12/2011
(Continued)

OTHER PUBLICATIONS

International Search Report to PCT/CN2018/081970 dated Jun. 28, 2018 and English translation, (7p).

*Primary Examiner* — Kevin Quarterman
(74) *Attorney, Agent, or Firm* — Arch & Lake LLP

(57) ABSTRACT

A light source and an illumination device including the light source are provided. By adjusting peak wavelengths, peak intensities and color coordinates of blue light, red light and green light in the illumination light emitted by the light source to preset ranges, the illumination light emitted by the light source has a specific spectral distribution. In another embodiment, a specific light color is achieved by a specific phosphor ratio. Not only the color theory is considered for the evaluation of the lighting effect, but also the influence of the spectrum on the actual lighting effect is considered. At the same time, the influence of the luminescent material on the spectrum is considered. Thus, a light source having a high comfort, a high preference, a high color rendering (Continued)

index, and a high color gamut index is obtained, and the light source has a similar effect to the sunlight.

20 Claims, 9 Drawing Sheets

(30) Foreign Application Priority Data

Aug. 24, 2017 (CN) .......................... 201710737787.3
Aug. 24, 2017 (CN) .......................... 201721068463.7

(51) Int. Cl.
*F21V 23/02* (2006.01)
*F21V 29/70* (2015.01)
*F21Y 115/10* (2016.01)

(52) U.S. Cl.
CPC ............ *H01L 33/507* (2013.01); *F21V 29/70* (2015.01); *F21Y 2115/10* (2016.08)

(56) References Cited

U.S. PATENT DOCUMENTS

| | | | |
|---|---|---|---|
| 2013/0020931 A1* | 1/2013 | Ko | C09K 11/0883 |
| | | | 313/503 |
| 2016/0365491 A1* | 12/2016 | Chen | G02B 6/0073 |
| 2017/0153382 A1* | 6/2017 | Wang | C09K 11/025 |
| 2017/0292071 A1* | 10/2017 | Moon | H01L 33/504 |

FOREIGN PATENT DOCUMENTS

| | | |
|---|---|---|
| CN | 102760820 A | 10/2012 |
| CN | 103408984 A | 11/2013 |
| CN | 105737091 A | 7/2016 |
| CN | 106870976 A | 6/2017 |
| CN | 107339667 A | 11/2017 |
| CN | 206708775 U | 12/2017 |
| CN | 207146291 U | 3/2018 |
| DE | 102006052222 A1 | 8/2008 |

* cited by examiner

LIGHT SOURCE AND ILLUMINATION DEVICE INCLUDING THE LIGHT SOURCE

CROSS-REFERENCE TO RELATED APPLICATIONS

This application is a continuation application of International Application No. PCT/CN2018/081970, filed with the State Intellectual Property Office of P. R. China on Apr. 4, 2018, which is based upon and claims priority to Chinese Patent Application No. 201710222549.9 filed on Apr. 7, 2017, Chinese Patent Application No. 201710737787.3 filed on Aug. 24, 2017, Chinese Patent Application No. 201720356377.X filed on Apr. 7, 2017, and Chinese Patent Application No. 201721068463.7 filed on Aug. 24, 2017, the entire contents of which are incorporated herein by reference.

TECHNICAL FIELD

The present disclosure relates to the field of lighting technology, and in particular, to a light source, and an illumination device including a light source.

BACKGROUND

With the advent and development of the third lighting technology revolution, LED (light-emitting diode) illumination devices are widely used, and people are increasingly demanding for the light quality of the LED lighting. At present, the lighting market, especially after entering an LED era, homogenization becomes more and more serious. In the case of homogenization, either one-sided emphasis on improving light efficiency or serious emphasis on a low-cost competition. At the same time, European countries and American countries are still unwilling to abandon traditional light sources such as incandescent lamps and halogen tungsten lamps. This is mainly because LEDs are not able to achieve the light quality of the traditional light sources for the time being. There are inherent defects in comfort and color rendering. This is a prominent problem in the current perception of a consumer for LED products.

In view of this situation, a white LED light source which is more comfortable, has higher color rendering and has the light color effect of daylight and tungsten halogen lamps is desired.

SUMMARY

The embodiments of the present disclosure provide an LED light source that can simultaneously achieve luminous efficiency, comfort, and color rendering.

In order to achieve the above functions, the present disclosure provides a light source, and the light source comprises: a blue light generating component, configured for emitting blue light; a green light generating component, configured for emitting green light; a red light generating component, configured for emitting red light; a peak wavelength of the blue light is in a range of 430 nm to 470 nm, and a half-width of an emission spectrum of the blue light is in a range of 15 nm to 35 nm; a peak wavelength of the green light is in a range of 510 nm to 560 nm, and a half-width of an emission spectrum of the green light is in a range of 80 nm to 130 nm; a peak wavelength of the red light is in a range of 600 nm to 660 nm, and a half-width of an emission spectrum of the red light is in a range of 70 nm to 105 nm; a peak intensity of the green light is 40% to 66% of a peak intensity of the blue light; a peak intensity of the red light is 40% to 60% of the peak intensity of the blue light; illumination light emitted by the light sources at following conditions in a CIE1931 color coordinate system: an abscissa X ranges from 0.309 to 0.349, and an ordinate Y ranges from 0.320 to 0.360.

In order to achieve the above functions, another embodiment of the present disclosure is to provide a light source, and the light source comprises: at least one first light-emitting element, in which the at least one first light-emitting element emits light with a peak wavelength in a range of 435 nm to 465 nm and a half-width of an emission spectrum of the at least one first light-emitting element is in a range of 15 nm to 35 nm; at least one first additional light-emitting body, in which the at least one first additional light-emitting body is configured to receive a portion of the light emitted by the at least one first light-emitting element and convert the portion of the light into light with a peak wavelength of 510 nm to 560 nm to emit, and a half-width of an emission spectrum of the at least one first additional light-emitting body is in a range of 80 nm to 130 nm; at least one-second additional light-emitting body, in which the at least one-second additional light-emitting body is configured to receive a portion of the light emitted by the at least one first light-emitting element and convert the portion of the light into light with a peak wavelength of 600 nm to 660 nm to emit, and a half-width of an emission spectrum of the at least one-second additional light-emitting body is in a range of 70 nm to 105 nm; light emitted by the light source is obtained by mixing the light emitted by the at least one first light-emitting element, the light emitted by the at least one first additional light-emitting body, and the light emitted by the at least one-second additional light-emitting body, and color of the light emitted by the light source satisfies following conditions in a CIE1931 color coordinate system:

an abscissa X ranges from 0.309 to 0.349, and an ordinate Y ranges from 0.320 to 0.360.

The present disclosure further provides an illumination device, and the illumination device comprises: any one light source as described above; a power supply module, connected with the light source to provide the power required for working of the light source.

The light source provided by the present disclosure has a specific spectral distribution or achieves a specific light color through a specific phosphor ratio. Not only the color theory is considered for the evaluation of the lighting effect, but also the influence of the spectrum on the actual lighting effect is considered. At the same time, the influence of the luminescent material on the spectrum is considered. Thus, a light source having a high comfort, a high preference, a high color rendering index, and a high color gamut index is obtained, and the light source has a similar effect compared to the sunlight.

DETAILED DESCRIPTION

A light source and an illumination device provided by the present disclosure are further described in detail below with reference to the accompanying drawings and specific embodiments.

Reference will now be made in detail to example embodiments, examples of which are illustrated in the accompanying drawings. The following description refers to the accompanying drawings in which the same numbers in different drawings represent the same or similar elements unless otherwise represented. The implementations set forth in the following description of the example embodiments do not represent all implementations consistent with the invention. Instead, they are merely examples of apparatuses and methods consistent with aspects related to the invention as recited in the appended claims.

The terminology used in the present disclosure is for the purpose of describing particular embodiments only and is not intended to limit the present disclosure. As used in the present disclosure and the appended claims, the singular forms "a," "an," and "the" are intended to include the plural forms as well, unless the context clearly indicates otherwise. It shall also be understood that the term "and/or" used herein is intended to signify and include any or all possible combinations of one or more of the associated listed items.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to a judgment" depending on the context.

Figure 1:
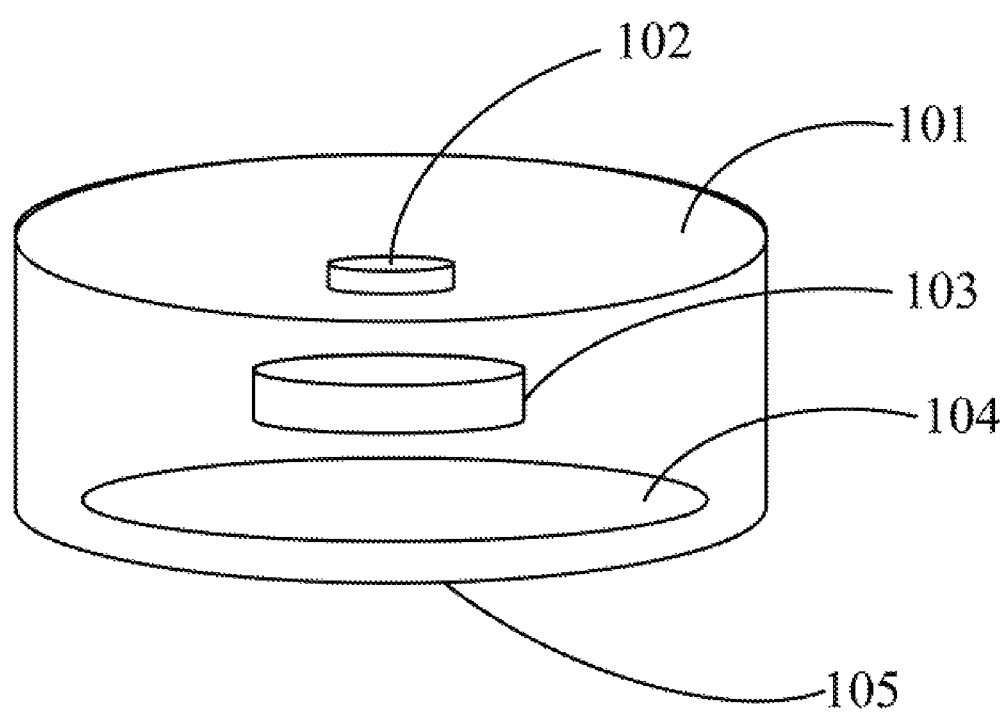
FIG. 1 is a schematic structural diagram of an illumination, according to an embodiment.

The light source provided by the present disclosure is a cold white light source with a color temperature between 4800 K and 6800 K and can be used in a lighting fixture 101 shown in FIG. 1 for daily illumination.

FIG. 1 shows a lighting fixture 101. The lighting fixture 101 includes a controller 102, a heat sink 103, an illumination module 104, a lampshade 105. The controller 102 can be used to adjust light color and light intensity of the illumination module 104. In other embodiments, the lampshade 105 can be replaced by other optical elements such as lenses, diffusion elements, light guides, and so on according to the design of the lighting fixture 101. In other embodiments, the heat sink can also be excluded. The light source 104 comprises a blue light generating component that emits a blue light composition, a green light generating component that emits a green light composition, and a red light generating component that emits a red light composition.

The light-emitting components of these different colors in the light source 104 can be either a light-emitting diode (LED) chip or fluorescent material that can convert a wavelength of light or a combination of the LED chip and the fluorescent material. The fluorescent material can be selected from different fluorescent powders according to the color of the emitted light.

For the blue light generating component, a monochrome LED chip can be used. The monochrome LED chip mentioned herein refers to an LED chip which does not have a fluorescent body and is directly excited by a semiconductor material to emit light. In addition, the blue light generating component can also use a mode in which the LED chip is combined with the fluorescent body, that is, the blue light generating component includes a semiconductor light-emitting element (an LED chip) and a blue fluorescent body that absorbs the light emitted by the semiconductor light-emitting element (the LED chip) and emits blue light by converting a wavelength of the light emitted by the semiconductor light-emitting element. The semiconductor light-emitting element herein can be a monochrome LED chip that emits ultraviolet light.

The red light generating component is similar to the blue light generating, and the red light generating component can use a monochrome LED chip, however, in a preferred embodiment, the red light generating component includes a red fluorescent body that absorbs the light emitted by the semiconductor light-emitting element and emits red light by converting a wavelength of the light emitted by the semiconductor light-emitting element.

The green light generating component comprises a green fluorescent body which absorbs the light emitted by a semiconductor light-emitting element and emits green light by converting a wavelength of the light emitted by the semiconductor light-emitting element. The types of the green fluorescent body comprise aluminate systems, such as YAG, Ga-YAG, Lu-AG, TbAG, and the like, or a silicate system, a nitride system or a nitrogen oxide system. The green light generating component can be excited by a fluorescent body to generate the green light, or it may be a combination of two or more kinds of fluorescent bodies, or may even be composed of a plurality of fluorescent bodies with various peak wavelengths, in a case where the green light generating component includes a variety of fluorescent bodies, these fluorescent bodies are not limited to one component, for example, the fluorescent bodies can be different green fluorescent bodies in two white LEDs. The spectral intensity between 510 nm and 560 nm is obtained by superimposing the spectra produced by the different green fluorescent bodies. The combination of the fluorescent bodies is not limited to the green light generating component. In a case where the blue light generating component and the red light generating component contain the fluorescent bodies, the fluorescent bodies of various components can also be used, and these fluorescent bodies can be distributed in different devices. It should be noted that the red light generating component and the green light generating component herein are only descriptions for illustrating the present disclosure. For example, if the emission bandwidth of the red fluorescent body is relatively wide, there is a portion of the energy in a green region. At this time, we can understand that the red fluorescent body partially achieves the function of the red light generating component and partially contributes to the green light emission, that is, the green light generating component is composed of the green fluorescent body and the red fluorescent body.

A final light color of the light source 104 is a mixture of light emitted from the light generating components of three different color lights mentioned above. Through a specific ratio design of different light generating components, combined with data of visual experiments, a color coordinate range of the light color of the light source 104 is that x ranges from 0.309 to 0.349, and y ranges from 0.320 to 0.360; a preferable color coordinate range is that x ranges from 0.319 to 0.339, and y ranges from 0.330 to 0.350; a more preferable color coordinate range is that x ranges from 0.324 to 0.334, and y ranges from 0.335 to 0.345. Color rendering parameters CRI and Rf of this spectrum both are not less than 85.0, a color rendering parameter R9 is not less than 50.0, and a color gamut index Rg is not less than 95.0.

Figure 15:
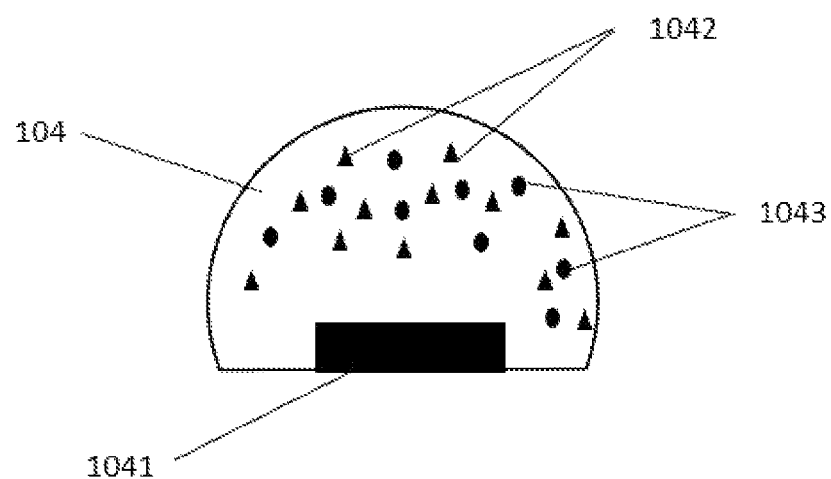
FIG. 15 is a schematic structural diagram of a light source, according to an embodiment of the present disclosure.

A specific embodiment of the light source 104 is a light-mixed white light LED encapsulating chip. As shown in FIG. 15, the light source 104 comprises at least one first light-emitting element 1041 to act as the blue light generating component. In the present embodiment, the first light-emitting element 1041 is a blue light LED. A peak wavelength of the light emitted by the first light-emitting element 1041 is from 430 nm to 470 nm, and a half-width of the emission spectrum is from 15 nm to 35 nm. The first light-emitting element 1041 acts as the blue light generating component in the light source 104. The spectral intensity of the first light-emitting element 1041 is the largest of the emission peaks composed of the three light colors. The light source 104 further comprises at least one first additional light-emitting body 1042 acting as a green light generating component. The first additional light-emitting body 1042 is configured for receiving a portion of the light emitted by the first light-emitting element and converts the portion of the light into light having a peak wavelength of 510 nm to 560 nm to emit. The half-width of the emission spectrum is in a range of 80 nm to 130 nm. A preferable range is from 80 nm to 100 nm and from 110 nm to 130 nm, and the spectral intensity of the emission spectrum is about 40% to 66% of the peak intensity of the blue light. In the present embodiment, the first additional light-emitting body 1042 is a green phosphor. Phosphor types that can be selected include an aluminate green powder GaYAG or LuAG, or a silicate green powder, or a salon green powder. The light source 104 further comprises at least one-second additional light-emitting body 1043 acting as a red light generating component. The second additional light-emitting body 1043 is configured for receiving a portion of the light emitted by the first light-emitting element and converts the portion of the light into light having a peak wavelength of 600 nm to 660 nm to emit. The half-width of the emission spectrum is in a range of 70 nm to 105 nm. A preferable range is from 70 nm to 85 nm and from 95 nm to 105 nm, and the spectral intensity of the emission spectrum is about 40% to 60% of the peak intensity of the blue light. In the present embodiment, the second additional light-emitting body 1043 is a red phosphor, preferably a nitride red phosphor. In the following examples, we choose two kinds of red phosphors, whose molecular formulas are $CaAlSiN_3{:}Eu$ and $Sr_2Si_5N_8{:}Eu$. In the present embodiment, the light source 104 is an encapsulated white light LED chip. Therefore, the light source 104 further comprises an encapsulating adhesive. The first additional light-emitting body 1042 and the second additional light-emitting body 1043 are evenly mixed in the encapsulating adhesive, and the mixed encapsulating adhesive covers the blue light LED chip which acts as the first light-emitting element 1041. In which a weight ratio of the second additional light-emitting body 1043 to the first additional light-emitting body 1042 ranges from 7.0% to 19.0%. A proportion of a sum of a weight of the first additional light-emitting body and a weight of the second additional light-emitting body in a total weight of the encapsulating adhesive after the first additional light-emitting body and the second additional light-emitting body are mixed into the encapsulating adhesive is from about 15% to 45%, and preferably from 20% to 30%. After encapsulating, the light source 104 is lighted up to form a white spectrum, and color temperature ranges from 4800 K to 6800 K. The color rendering parameters CRI, R9, Rf and the color gamut index Rg of the spectrum have high values.

In addition, light emitted by the light source 104 in the embodiment of the present disclosure further has the following features: in a case of the same wavelength, A1 ($\lambda$) represents a change rate of spectral intensities of adjacent wavelengths of a luminescence spectrum of the light source 104, and A2 ($\lambda$) represents a change rate of spectral intensities of adjacent wavelengths of a reference spectrum of solar light which has the same lumen output as the light source 104. A difference A ($\lambda$) between A1 ($\lambda$) and A2 ($\lambda$) is within an interval [−5.0, 5.0], that is −5.0≤A1($\lambda$)−A2($\lambda$)≤5.0. In a preferable embodiment, −3.0≤A1($\lambda$)−A2($\lambda$)≤3.0.

In the embodiment of the present disclosure, adjacent refers to 5 nm acting as a calculation interval, that is, in a case of calculating the change rate of the spectral intensities of adjacent wavelengths, it is calculated at an interval of 5 nm. Specific operation formulas for A1 ($\lambda$) and A2 ($\lambda$) are as follows:

$$A1(\lambda) = \left[P(\lambda) * \frac{100}{\sum(P(\lambda)*V(\lambda))} - P(\lambda-1) * \frac{100}{\sum(P(\lambda)*V(\lambda))}\right];$$

$$A2(\lambda) = \left[R(\lambda) * \frac{100}{\sum(R(\lambda)*V(\lambda))} - R(\lambda-1) * \frac{100}{\sum(R(\lambda)*V(\lambda))}\right];$$

in which P($\lambda$) is an emission spectrum of the light source, R($\lambda$) is an emission spectrum of reference solar light having a same color temperature as the light source, and V($\lambda$) is a function of light visual efficiency of the bright visual spectrum.

The emission spectrum R($\lambda$) of the reference solar light is calculated according to the following formula:

$R(\lambda)=S_0(\lambda)+S_1(\lambda)*(-1.3515-1.7703*XD+5.9114*YD)/(0.0241+0.2562*XD-0.7341*YD)+S_2(\lambda)*(0.03-31.4424*XD+30.0717*YD)/(0.0241+0.2562*XD-0.7341*YD);$ $XD=-4.607*10^{-9}/CCT^{-3}+2.9678*10^{-6}/CCT^{-2}+0.09911*10^{-3}/CCT+0.244063;$ $YD=-3*XD^{-2}+2.87*XD-0.275;$ CCT is a spectral color temperature value, $S_0$ ($\lambda$) is a standard solar light spectrum Daylight 6500K. $S_1$ ($\lambda$) and $S_2$ ($\lambda$) are correction coefficients.

In practical applications, for different types of phosphors, the proportions of the weights of the powders are different, and the types and the weight ratios of the phosphors of the several preferred embodiments of the light source 104 are shown in the following table:

| | red phosphor | weight of red powder wt1 (g) | green phosphor | weight of green powder wt2 (g) | weight of encapsulating adhesive wt3 (g) | wt1/wt2 | (wt1 + wt2)/ (wt1 + wt2 + wt3) |
|---|---|---|---|---|---|---|---|
| First embodiment | $CaAlSiN_3$:Eu | 0.27 | LuAG | 3.02 | 7.8 | 8.9% | 29.7% |
| Second embodiment | $CaAlSiN_3$:Eu | 0.28 | silicate green phosphor | 1.78 | 7.8 | 15.7% | 20.9% |
| Third embodiment | $CaAlSiN_3$:Eu | 0.31 | GaYAG | 1.89 | 7.8 | 16.4% | 22.0% |
| Fourth embodiment | $Sr_2Si_5N_8$:Eu | 0.34 | silicate green phosphor | 1.87 | 7.8 | 18.2% | 22.1% |
| Fifth embodiment | $Sr_2Si_5N_8$:Eu | 0.51 | LuAG, | 3.22 | 7.8 | 15.8% | 32.4% |
| Sixth embodiment | $Sr_2Si_5N_8$:Eu | 0.25 | GaYAG | 1.68 | 7.8 | 14.9% | 19.8% |

In the table above, wt1/wt2 represents the weight ratio of the second additional light-emitting body 1043 to the first additional light-emitting body 1042, while (wt1+wt2)/(wt1+wt2+wt3) represents a ratio of the phosphors (the first additional light-emitting body and the second additional light-emitting body) to a total weight of the encapsulating adhesive mixed with the phosphors (the first additional light-emitting body and the second additional light-emitting body). These weight ratios in the above table are the actual data in a batch of products, due to the different purity of the phosphors in each of the batches, the particle sizes are slightly different from each other. In order to avoid these factors affecting the final light color, the weight ratios of the two phosphors in each batch of the products are adjusted compared with the data in the above table, and the adjustment range is basically within ±0.5%. The proportion of the weights of the first additional light-emitting body and the second additional light-emitting body in a total weight of the encapsulating adhesive after the first additional light-emitting body and the second additional light-emitting body are mixed into the encapsulating adhesive is mainly in a range of 20% to 30%, this is because the selected phosphors have a high purity, and in a case where the quality and the purity of the phosphors are poor, the proportion of phosphors is greater. In addition, we can also see that the weight ratio of $CaAlSiN_3$:Eu and the green phosphor is generally larger than the weight ratio of $Sr_2Si_5N_8$:Eu and the green phosphor due to the difference in molecular formulas. The weight ratio of the second additional light-emitting body 1043 to the first additional light-emitting body 1042 is in the range of 8.0% to 17.0% in the case that $CaAlSiN_3$:Eu is used as the red phosphor, and the weight ratio of the second additional light-emitting body 1043 to the first additional light-emitting body 1042 is in the range of 14.0% to 19.0% in a case that $Sr_2Si_5N_8$:Eu is used as the red phosphor.

Some embodiments of the light source 104 are described below.

In a first embodiment, in the light source 104, the first light-emitting element 1041 is a blue light LED chip, which emits blue light with a peak wavelength of 445±5 nm and acts as a blue light generating component. The first additional light-emitting body 1042 is a LuAG green phosphor in an aluminate system, acts as a green light generating component, and can convert a portion of the blue light emitted by the blue light generating component into green light. The second additional light-emitting body 1043 is a nitride red phosphor $CaAlSiN_3$:Eu acts as a red light generating component and can convert a portion of the blue light emitted by the blue light generating component into red light. In the present embodiment, the blue light LED chip not only serves as the blue light generating component but also serves as an excitation light source for the red light generating component and the green light generating component.

Figure 2:
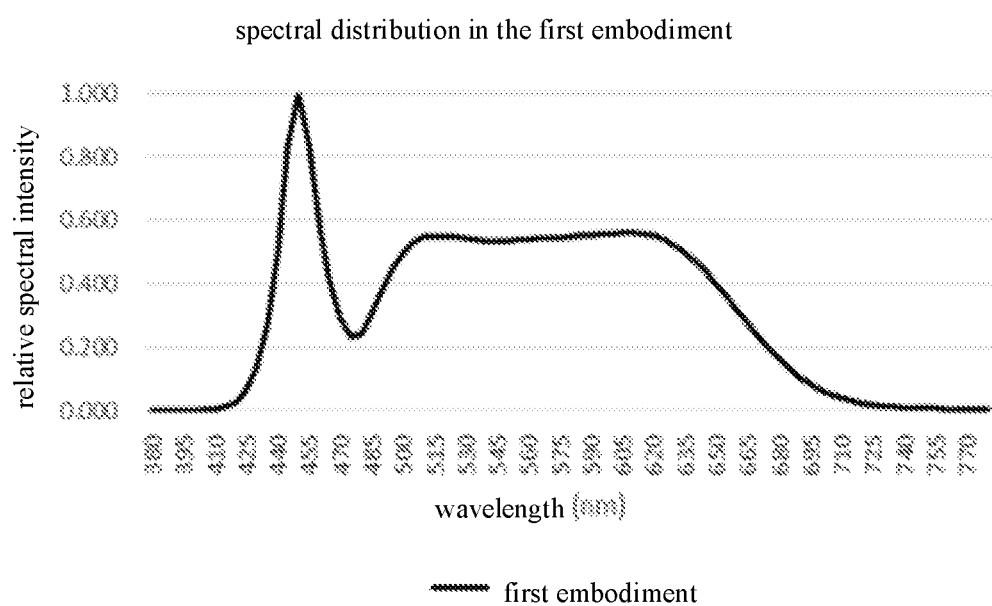
FIG. 2 is a relative spectral energy distribution, according to an embodiment.

FIG. 2 is a relative spectral energy distribution diagram of the first embodiment of the present disclosure. In FIG. 2, the energy of the blue light emitted by the blue light LED chip forms a first peak with a peak wavelength of 450 nm and a half-width FWHM of 21.8±5 nm (21.8 is a measured value of the light source, in the actual productions, the measured values of the half-width of each of the light sources in the same batch slightly deviate, so there is a positive and negative interval and the subsequent values are the same). The green phosphor converts a portion of the blue light emitted by the blue light LED chip into a green light to form a second peak. A main peak wavelength of the second emission peak is 515 nm. The half-width of the emission spectrum of the green phosphor is 129.4±5 nm. The spectral intensity of the second emission peak is 55.0% of the spectral intensity of the first emission peak. The red phosphor converts a portion of the blue light emitted by the blue light LED chip into red light. In FIG. 2, a third peak is formed. The peak wavelength of the third peak is 615 nm, the half-width FWHM of the third peak is 80±5 nm, and the peak intensity of the third peak is about 55.8% of the intensity of the first peak.

Figure 3:
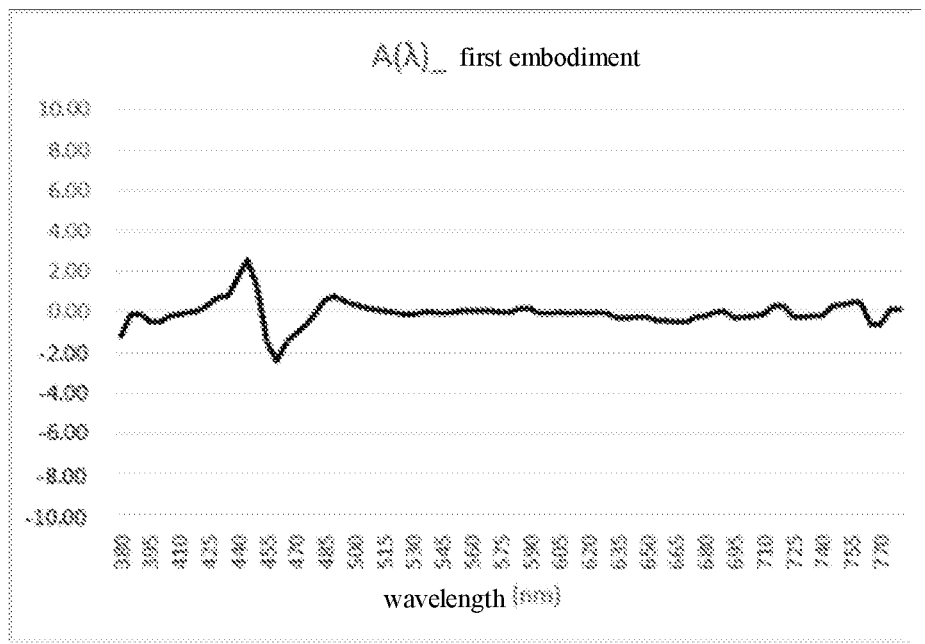
FIG. 3 is a distribution diagram of A (k), according to an embodiment of the present disclosure.

FIG. 3 shows the distribution of A (λ) in the first embodiment of the present disclosure. A (λ)=A1 (λ)−A2 (λ) and the value of A (λ) is within −2.4 to 2.6. The color coordinates of the first embodiment are x=0.3434, y=0.3520, the color temperature is 5067K, the color rendering index CRI is 93.5, R9 is 64.5, Rf is 90.6, and the color gamut index Rg is 100.4.

In a second embodiment, in the light source 104, the first light-emitting element 1041 is a blue light LED chip, which emits blue light with a peak wavelength of 445±5 nm and acts as a blue light generating component. The first additional light-emitting body 1042 is silicate green phosphor, acts as a green light generating component, and can convert a portion of the blue light emitted by the blue light generating component into green light. The second additional light-emitting body 1043 is a nitride red phosphor CaAlSiN3:Eu acts as a red light generating component and can convert a portion of the blue light emitted by the blue light generating component into red light. In the present embodiment, the LED chip for emitting the blue light not only serves as the blue light generating component, but also serves as an excitation light source for the red light generating component and the green light generating component.

Figure 4:
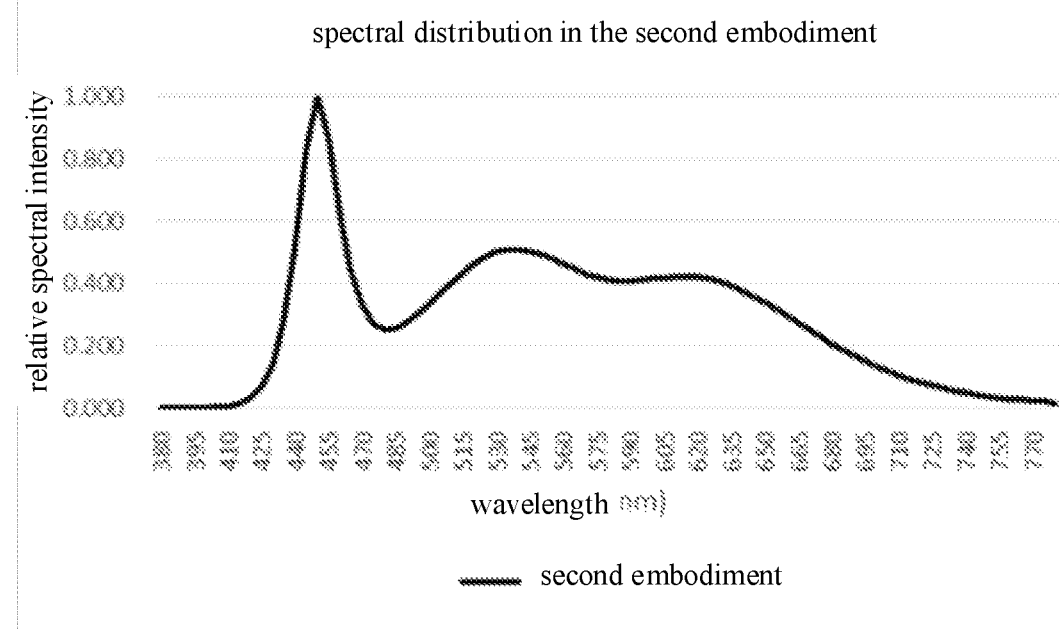
FIG. 4 a relative spectral energy distribution diagram, according to an embodiment of the present disclosure.

FIG. 4 is a relative spectral energy distribution diagram of the second embodiment of the present disclosure. In FIG. 4, the energy of the blue light emitted by the LED chip for emitting blue light forms a first peak with a peak wavelength of 450 nm and a half-width FWHM of 21.8±5 nm. The green phosphor converts a portion of the blue light emitted by the LED chip for emitting blue light into a green light to form a second peak. A main peak wavelength of the second emission peak is 540 nm. The half-width of the emission spectrum of the green phosphor is 90±5 nm. The spectral intensity of the second emission peak is 51.0% of the spectral intensity of the first emission peak. The red phosphor converts a portion of the blue light emitted by the LED chip for emitting blue light into red light. In FIG. 4, a third peak is formed. The peak wavelength of the third peak is 615 nm, the half-width FWHM of the third peak is 80±5 nm, and the peak intensity of the third peak is about 44.2% of the intensity of the first peak.

Figure 5:
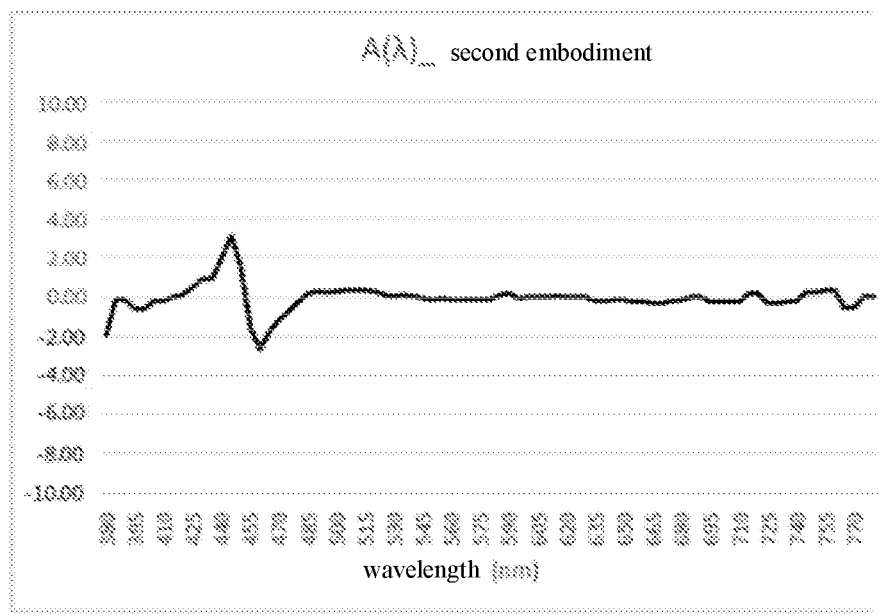
FIG. 5 is a distribution diagram of A (λ), according to an embodiment.

FIG. 5 shows the distribution of A ($\lambda$) in the second embodiment of the present disclosure. A ($\lambda$)=A1 ($\lambda$)−A2 ($\lambda$) and the value of A ($\lambda$) is within −2.7 to 3.1. The color coordinates of the second embodiment are x=0.3221, y=0.3310, the color temperature is 5973K, the color rendering index CRI is 92.4, R9 is 85.2, Rf is 88.0, and the color gamut index Rg is 102.0.

In a third embodiment, in the light source 104, the first light-emitting element 1041 is a blue light LED chip, which emits blue light with a peak wavelength of 445±5 nm and acts as a blue light generating component. The first additional light-emitting body 1042 is GaYAG green phosphor in the aluminate system, acts as a green light generating component, and can convert a portion of the blue light emitted by the blue light generating component into green light. The second additional light-emitting body 1043 is a nitride red phosphor CaAlSiN3:Eu acts as a red light generating component and can convert a portion of the blue light emitted by the blue light generating component into red light. In the present embodiment, the blue light LED chip not only serves as the blue light generating component but also serves as an excitation light source for the red light generating component and the green light generating component.

Figure 6:
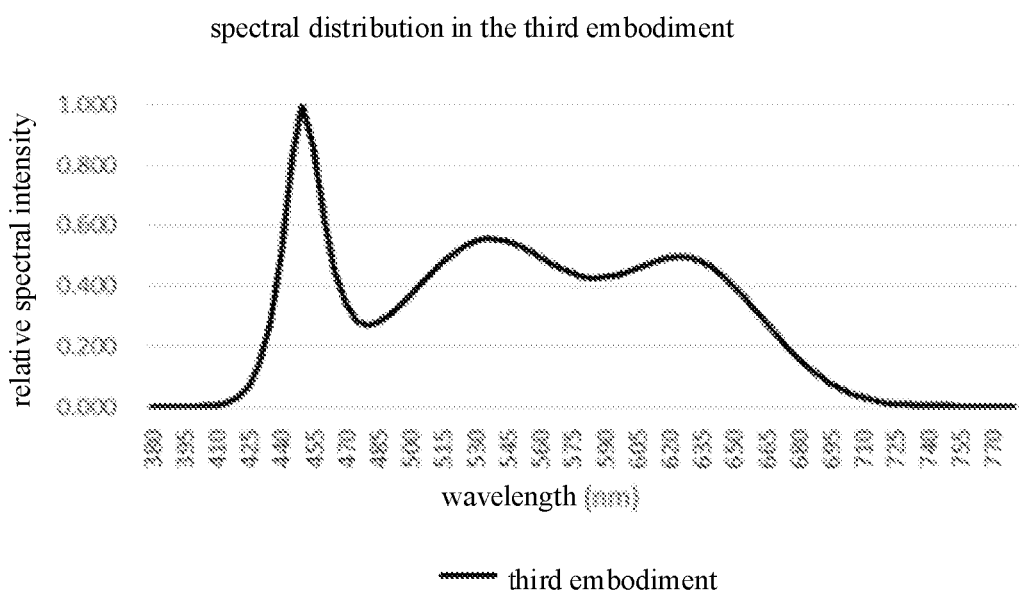
FIG. 6 is a relative spectral energy distribution diagram, according to an embodiment of the present disclosure.

FIG. 6 is a relative spectral energy distribution diagram of the third embodiment of the present disclosure. In FIG. 6, the energy of the blue light emitted by the blue light LED chip forms a first peak with a peak wavelength of 450 nm and a half-width FWHM of 21.8±5 nm. The green phosphor converts a portion of the blue light emitted by the blue light LED chip into a green light to form a second peak. A main peak wavelength of the second emission peak is 535 nm. The half-width of the emission spectrum of the green phosphor is 90±5 nm. The spectral intensity of the second emission peak is 57.2% of the spectral intensity of the first emission peak. The red phosphor converts a portion of the blue light emitted by the blue light LED chip into red light. In FIG. 6, a third peak is formed. The peak wavelength of the third peak is 625 nm, the half-width FWHM of the third peak is 80±5 nm, and the peak intensity of the third peak is about 49% of the intensity of the first peak.

Figure 7:
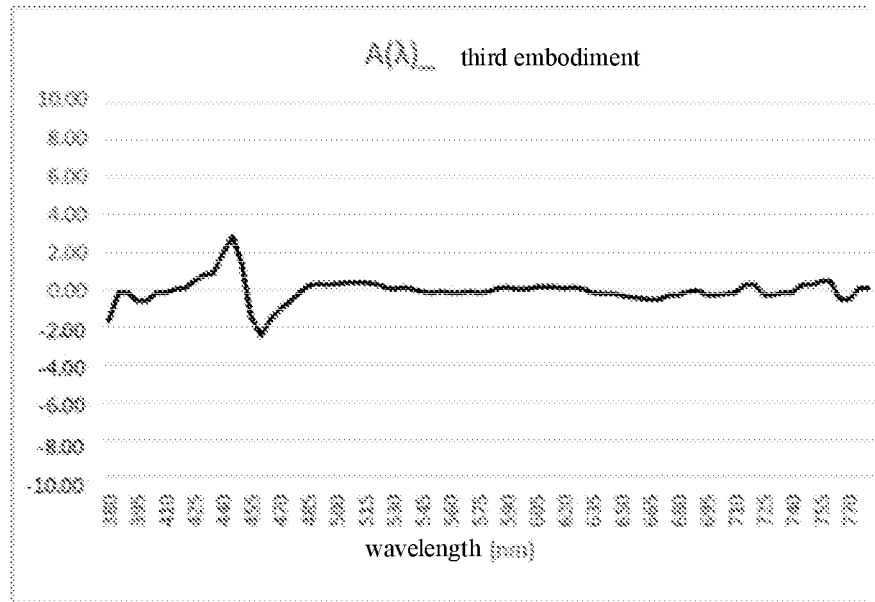
FIG. 7 is a distribution diagram of A (λ), according to an embodiment of the present disclosure.

FIG. 7 shows the distribution of A ($\lambda$) in the third embodiment of the present disclosure. A ($\lambda$)=A1 ($\lambda$)−A2 ($\lambda$) the value of A (2) is within −2.4 to 2.9. The color coordinates of the third embodiment are x=0.3292, y=0.3391, the color temperature is 5634K, the color rendering index CRI is 93.8, R9 is 94.0, Rf is 89.7, and the color gamut index Rg is 102.8.

In a fourth embodiment, in the light source 104, the first light-emitting element 1041 is a blue light LED chip, which emits blue light with a peak wavelength of 445±5 nm and acts as a blue light generating component. The first additional light-emitting body 1042 is silicate green phosphor, acts as a green light generating component, and can convert a portion of the blue light emitted by the blue light generating component into green light. The second additional light-emitting body 1043 is a nitride red phosphor $Sr_2Si_5N_8$:Eu acts as a red light generating component and can convert a portion of the blue light emitted by the blue light generating component into red light. In the present embodiment, the blue light LED chip not only serves as the blue light generating component but also serves as an excitation light source for the red light generating component and the green light generating component.

Figure 8:
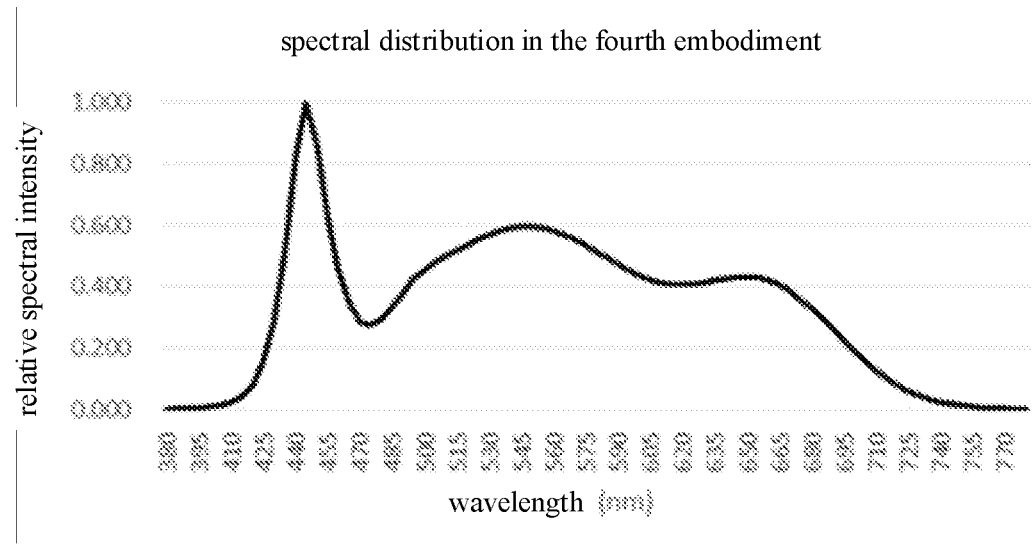
FIG. 8 a relative spectral energy distribution diagram, according to an embodiment of the present disclosure.

FIG. 8 is a relative spectral energy distribution diagram of the fourth embodiment of the present disclosure. In FIG. 8, the energy of the blue light emitted by the blue light LED chip for emitting blue light forms a first peak with a peak wavelength of 445 nm and a half-width FWHM of 21.4±5 nm. The green phosphor converts a portion of the blue light emitted by the blue light LED chip into a green light to form a second peak. A main peak wavelength of the second emission peak is 550 nm. The half-width of the emission spectrum of the green phosphor is 120±5 nm. The spectral intensity of the second emission peak is 59.5% of the spectral intensity of the first emission peak. The red phosphor converts a portion of the blue light emitted by the blue light LED chip into red light. In FIG. 8, a third peak is formed. The peak wavelength of the third peak is 650 nm, the half-width FWHM of the third peak is 80±5 nm, and the peak intensity of the third peak is about 43.2% of the intensity of the first peak.

Figure 9:
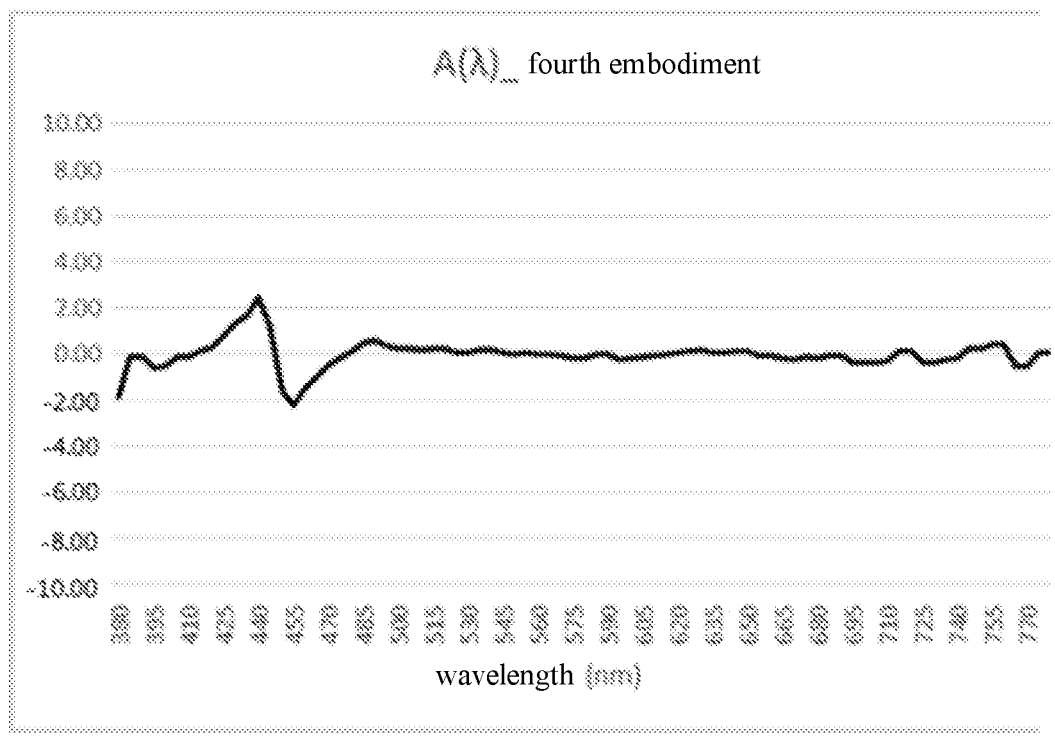
FIG. 9 is a distribution diagram of A (λ), according to an embodiment of the present disclosure.

FIG. 9 shows the distribution of A ($\lambda$) in the fourth embodiment of the present disclosure. A ($\lambda$)=A1 ($\lambda$)−A2 ($\lambda$) and the value of A ($\lambda$) is within −2.2 to 2.5. The color coordinates of the fourth embodiment are x=0.3228, y=0.3454, the color temperature is 5942K, the color rendering index CRI is 86.3, R9 is 61.3, Rf is 86.5, and the color gamut index Rg is 100.1.

In a fifth embodiment, for the light source 104, the first light-emitting element 1041 is a blue light LED chip, which emits blue light with a peak wavelength of 445±5 nm and acts as a blue light generating component. The first additional light-emitting body 1042 is LuAG green phosphor in the aluminate system, acts as a green light generating component, and can convert a portion of the blue light emitted by the blue light generating component into green light. The second additional light-emitting body 1043 is a nitride red phosphor $Sr_2Si_5N_8$:Eu acts as a red light generating component and can convert a portion of the blue light emitted by the blue light generating component into red light. In the present embodiment, the blue light LED chip not only serves as the blue light generating component but also serves as an excitation light source for the red light generating component and the green light generating component.

Figure 10:
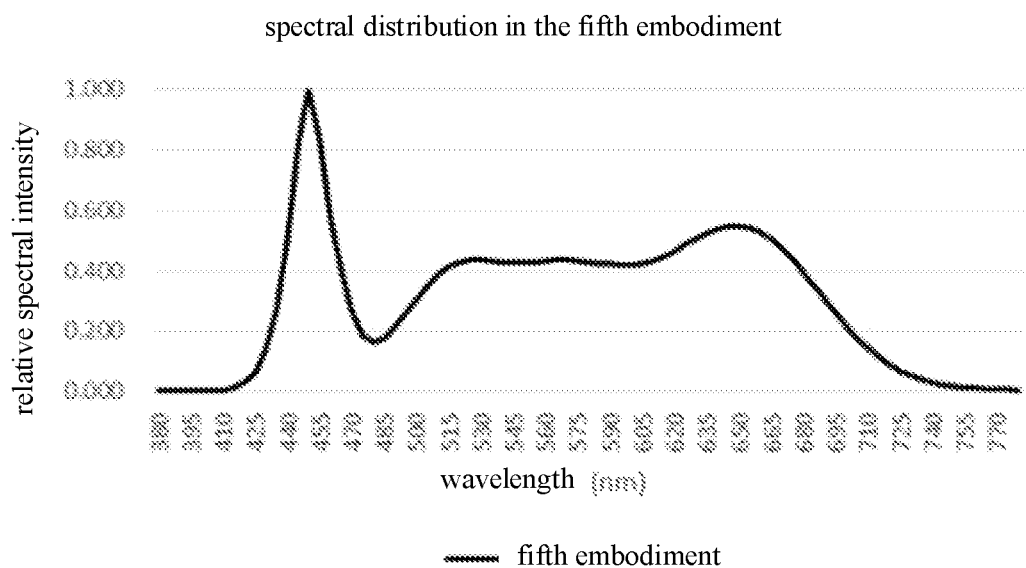
FIG. 10 is a relative spectral energy distribution diagram, according to an embodiment of the present disclosure.

FIG. 10 is a relative spectral energy distribution diagram in the fifth embodiment of the present disclosure. In FIG. 10, the energy of the blue light emitted by the blue light LED chip forms a first peak with a peak wavelength of 450 nm and a half-width FWHM of 21.8±5 nm. The green phosphor converts a portion of the blue light emitted by the blue light LED chip into a green light to form a second peak. A main peak wavelength of the second emission peak is 530 nm. The half-width of the emission spectrum of the green phosphor is 122±5 nm. The spectral intensity of the second emission peak is 43.9% of the spectral intensity of the first emission peak. The red phosphor converts a portion of the blue light emitted by the blue light LED chip into red light. In FIG. 10, a third peak is formed. The peak wavelength of the third peak is 650 nm, the half-width FWHM of the third peak is 80.4±5 nm, and the peak intensity of the third peak is about 54.8% of the intensity of the first peak.

Figure 11:
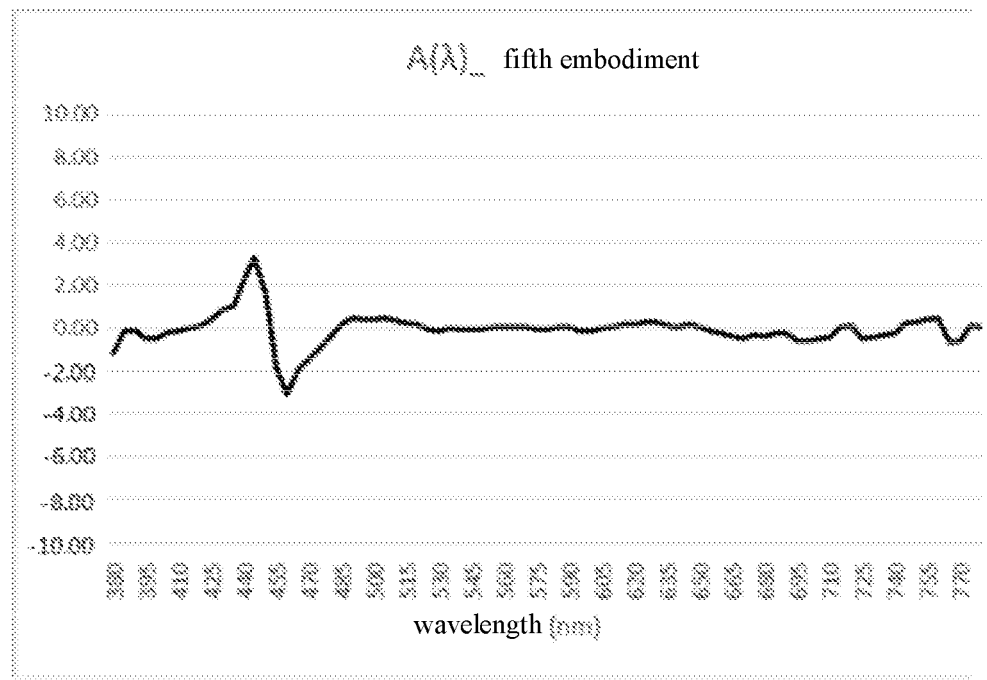
FIG. 11 is a distribution diagram of A (λ), according to an embodiment of the present disclosure.

FIG. 11 shows the distribution of A ($\lambda$) in the fifth embodiment of the present disclosure. A ($\lambda$)=A1 ($\lambda$)−A2 ($\lambda$) and the value of A ($\lambda$) is within −3.0 to 3.3. The color coordinates of the fifth embodiment are x=0.3436, y=0.3253, the color temperature is 4948K, the color rendering index CRI is 90.9, R9 is 59.6, Rf is 86.1, and the color gamut index Rg is 108.6.

in a sixth embodiment, for the light source 104, the first light-emitting element 1041 is a blue light LED chip, which emits blue light with a peak wavelength of 445±5 nm and acts as a blue light generating component. The first additional light-emitting body 1042 is GaYAG green phosphor in the aluminate system, acts as a green light generating component, and can convert a portion of the blue light emitted by the blue light generating component into green light. The second additional light-emitting body 1043 is a nitride red phosphor $Sr_2Si_5N_8$:Eu acts as a red light generating component and can convert a portion of the blue light emitted by the blue light generating component into red light. In the present embodiment, the blue light LED chip not only serves as the blue light generating component but also serves as an excitation light source for the red light generating component and the green light generating component.

Figure 12:
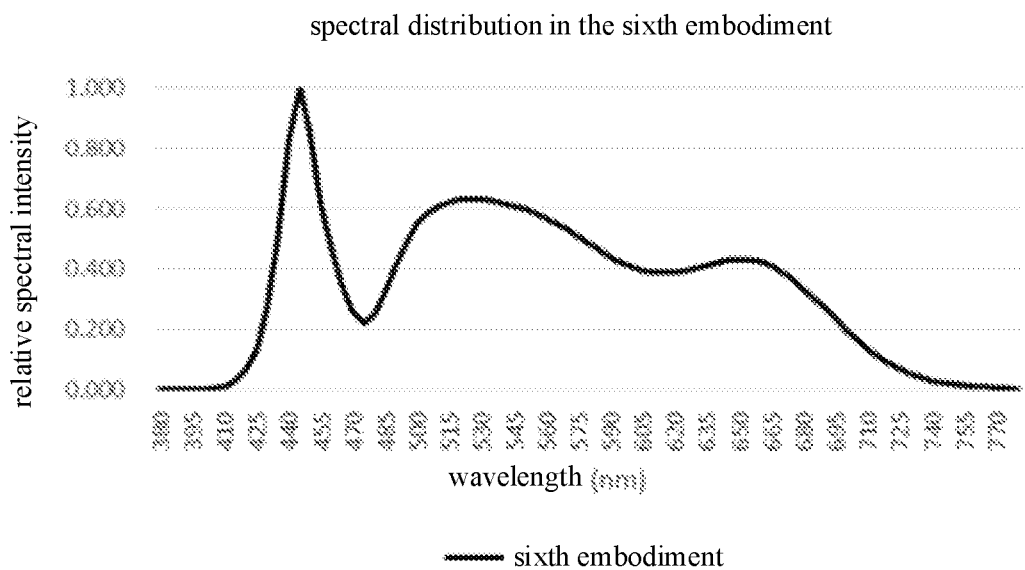
FIG. 12 is a relative spectral energy distribution diagram, according to an embodiment of the present disclosure.

FIG. 12 is a relative spectral energy distribution diagram of the sixth embodiment of the present disclosure. In FIG. 12, the energy of the blue light emitted by the blue light LED chip forms a first peak with a peak wavelength of 445 nm and a half-width FWHM of 21.8±5 nm. The green phosphor converts a portion of the blue light emitted by the blue light LED chip into a green light to form a second peak. A main peak wavelength of the second emission peak is 525 nm. The half-width of the emission spectrum of the green phosphor is 100.7±5 nm. The spectral intensity of the second emission peak is 63.2% of the spectral intensity of the first emission peak. The red phosphor converts a portion of the blue light emitted by the blue light LED chip into red light. In FIG. 12, a third peak is formed. The peak wavelength of the third peak is 650 nm, the half-width FWHM of the third peak is 80±5 nm, and the peak intensity of the third peak is about 43.3% of the intensity of the first peak.

Figure 13:
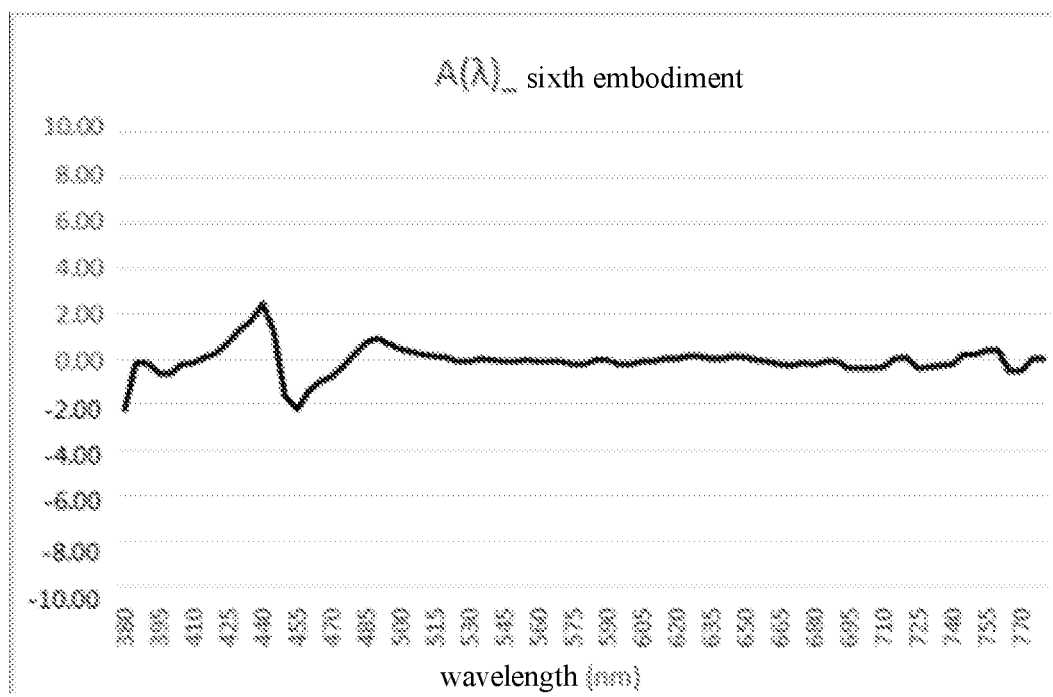
FIG. 13 is a distribution diagram of A (λ), according to an embodiment of the present disclosure.

FIG. 13 shows the distribution of A ($\lambda$) in the sixth embodiment. A ($\lambda$)=A1 ($\lambda$)-A2 ($\lambda$) and the value of A ($\lambda$) is within −2.2 to 2.5. The color coordinates of the sixth embodiment are x=0.3151, y=0.3545, the color temperature is 6292K, the color rendering index CRI is 86.2, R9 is 62.0, Rf is 88.2, and the color gamut index Rg is 99.2.

The light color of the light source in the present disclosure is standard white light, and the Duv (Duv represents a distance to a standard black trace curve) is between positive 0.005 and negative 0.005.

Figure 14:
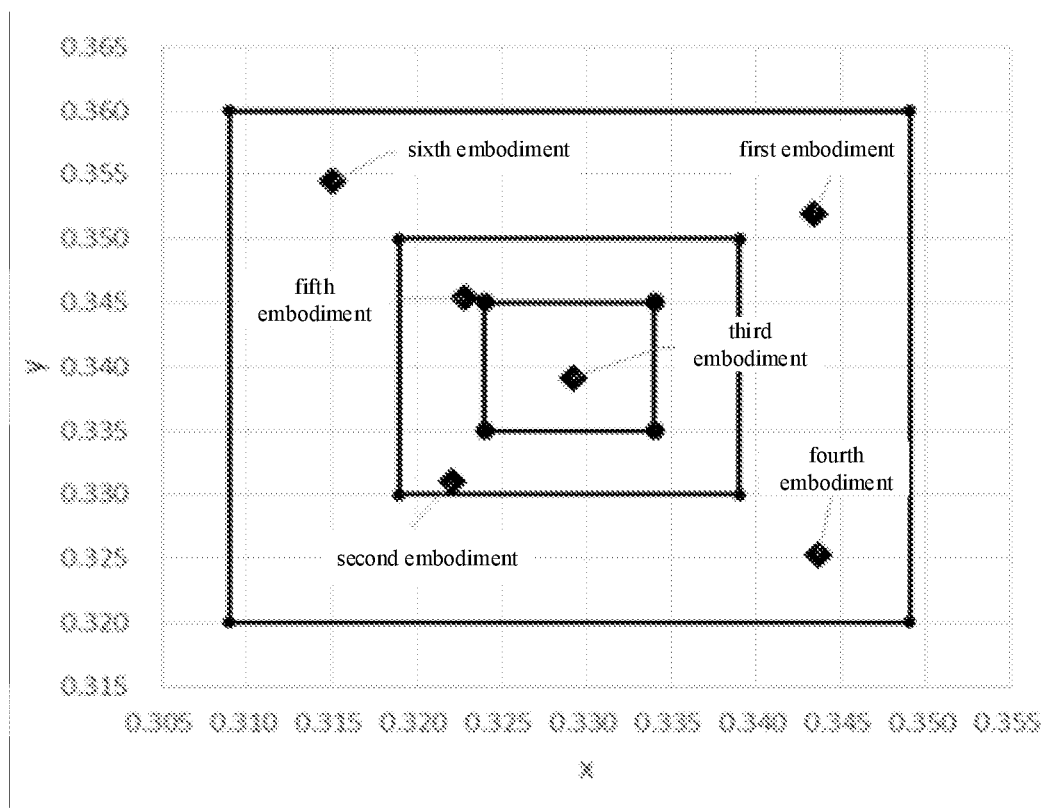
FIG. 14 is a CIE 1931 color coordinate diagram, according to an embodiment of the present disclosure.

FIG. 14 shows the light color coordinate values of respective light sources 104 in the CIE 1931 color coordinates for the first through sixth embodiment. It can be found that all of the points fall within the coordinate ranges of x=0.309 to x=0.349 and y=0.320 to y=0.360. The effects of the second, third, and fifth embodiment may be favorable in some instances. Their color coordinates range from x=0.319 to x=0.339 and from y=0.330 to y=0.350. A preferable range is from x=0.324 to x=0.334 and from y=0.335 to y=0.345. The third embodiment is within this range. The effect of the third embodiment is verified by visual experiments.

The above descriptions of the embodiments of the present disclosure are for illustration and description, and are not intended to exhaust or limit the present disclosure to specific forms disclosed. It is apparent that many modifications and variations are possible to be made, and the modifications and variations may be apparent to those skilled in the art and should be included in the scope of the present disclosure as defined by the appended claims.

Furthermore, the illumination light emitted by the light source further satisfies following conditions: at a same wavelength, a difference A ($\lambda$) between a change rate A1 ($\lambda$) of spectral intensities of adjacent wavelengths of a luminescence spectrum of the light source and a change rate A2 ($\lambda$) of spectral intensities of adjacent wavelengths of a reference spectrum of solar light which has a same lumen output as the light source is within an interval [−5.0, 5.0].

Additionally, the A ($\lambda$) is within an interval [−3.0, 3.0].

Further, the half-width of the emission spectrum of the green light is in a range of 80 nm to 100 nm or a range of 110 nm to 130 nm.

Further, the half-width of the emission spectrum of the red light is in a range of 70 nm to 85 nm or in a range of 95 nm to 105 nm.

Further, the blue light generating component is a blue light LED chip.

Further, the green light generating component comprises a green light fluorescent body that absorbs the blue light emitted by the blue light generating component and emits the green light by converting a wavelength of the blue light.

Further, the red light generating component comprises a red light fluorescent body that absorbs the blue light emitted by the blue light generating component and emits the red light by converting a wavelength of the blue light.

Further, the blue light generating component, the green light generating component, and the red light generating component are packaged into a whole, the blue light generating component is a blue light LED, the green light generating component is a green light fluorescent body which absorbs the blue light emitted by the blue light generating component and emits the green light by converting a wavelength of the blue light, and the red light generating component is a red light fluorescent body which absorbs the blue light emitted by the blue light generating component and emits the red light by converting a wavelength of the blue light.

Further, the green light fluorescent body is an aluminate system, or a silicate system, or a nitride system, or a nitrogen oxide system, or a combination of any two thereof.

Further, the red light fluorescent body is a nitride system, or a silicate system, or a combination of the nitride system and the silicate system.

Further, the abscissa X ranges from 0.319 to 0.339, and the ordinate Y ranges from 0.330 to 0.350.

Further, the abscissa X ranges from 0.324 to 0.334, and the ordinate Y ranges from 0.335 to 0.345.

Further, a color temperature of the illumination light emitted by the light source ranges from 4800 K to 6800 K.

Further, a color rendering parameter CRI of the illumination light emitted by the light source is greater than 85.

Further, a color rendering index Rf of the illumination light emitted by the light source is greater than 85.

Further, a color rendering index R9 of the illumination light emitted by the light source is greater than 50.

Further, a color gamut index Rg of the illumination light emitted by the light source is greater than 95.

Further, the at least one-second additional light-emitting body is a nitride red phosphor.

Further, a weight ratio of the second additional light-emitting body to the first additional light-emitting body ranges from 7.0% to 19.0%.

Further, at least one-second additional light-emitting body is CaAlSiN$_3$:Eu.

Further, a weight ratio of the second additional light-emitting body to the first additional light-emitting body ranges from 8.0% to 17.0%.

Further, the at least one first additional light-emitting body is LuAG phosphor, and a weight ratio of the second additional light-emitting body to the first additional light-emitting body is in a range of 8.9±0.5%.

Further, the at least one first additional light-emitting body is GaYAG series aluminate green phosphor, and a weight ratio of the second additional light-emitting body to the first additional light-emitting body is in a range of 16.4±0.5%.

Further, the at least one-second additional light-emitting body is a silicate green phosphor, a weight ratio of the second additional light-emitting body to the first additional light-emitting body is in a range of 15.7±0.5%.

Further, the at least one-second additional light-emitting body is Sr$_2$Si$_5$N$_8$:Eu.

Further, a weight ratio of the second additional light-emitting body to the first additional light-emitting body ranges from 14.0% to 19.0%.

Further, the at least one first additional light-emitting body is LuAG phosphor, a weight ratio of the second additional light-emitting body to the first additional light-emitting body is in a range of 15.8±0.5%.

Further, the at least one first additional light-emitting body is GaYAG series aluminate green phosphor, a weight ratio of the second additional light-emitting body to the first additional light-emitting body is in a range of 14.9±0.5%.

Further, the at least one-second additional light-emitting body is a silicate green phosphor, a weight ratio of the second additional light-emitting body to the first additional light-emitting body is in a range of 18.2±0.5%.

Further, the at least one first additional light-emitting body and the at least one-second additional light-emitting body are mixed and included in an encapsulating adhesive, and a proportion of a sum of a weight of the at least one first additional light-emitting body and a weight of the at least one-second additional light-emitting body in a total weight of the encapsulating adhesive after the at least one first additional light-emitting body and the at least one-second additional light-emitting body are mixed into the encapsulating adhesive is from 15% to 45%.

Further, the at least one first additional light-emitting body and the at least one-second additional light-emitting body are mixed and included in the encapsulating adhesive, and the proportion of the sum of the weight of the at least one first additional light-emitting body and the weight of the at least one-second additional light-emitting body in the total weight of the encapsulating adhesive after the at least one first additional light-emitting body and the at least one-second additional light-emitting body are mixed into the encapsulating adhesive is from 20% to 30%.

Further, the at least one first light-emitting element is a blue light LED chip, and the encapsulating adhesive overlays the blue light LED chip.

Further, a color rendering parameter CRI of the light emitted by the light source is greater than 85.

Further, a color gamut index Rg of the light emitted by the light source is greater than 95.

Further, the at least one first additional light-emitting body is a green phosphor.

Further, the at least one first additional light-emitting body is an aluminate green powder GaYAG or LuAG, or a silicate green powder, or a salon green powder.

Further, the illumination device further comprises a controller, and the controller is connected with the light source for adjusting the illumination light emitted by the light source.

So far, it should be recognized by those skilled in the art that, although a plurality of exemplary embodiments of the present disclosure have been illustrated and described in detail herein, many other variations or modifications that conform to the principles of the present disclosure may still be directly determined or derived from the contents disclosed by the present disclosure without departing from the spirit and scope of the present disclosure. Therefore, the scope of the present disclosure should be understood and confirmed as covering all the other variations or modifications.

What is claimed is:

1. A light source, comprising:
a blue light generating component configured to emit blue light, wherein the blue light generating component is a blue light LED chip;
a green light generating component configured to emit green light, wherein the green light generating component comprises a green light fluorescent body which absorbs the blue light emitted by the blue light generating component and emits the green light by converting a wavelength of the blue light; and
a red light generating component configured to emit red light,
wherein a difference between a first change rate and a second change rate is within a pre-determined range, wherein the first change rate is a change rate of spectral intensities of adjacent wavelengths of a luminescence spectrum of light emitted by the light source, wherein the second change rate is a change rate of spectral intensities of adjacent wavelengths of a reference spectrum of solar light having a same lumen output as the light emitted by the light source.

2. The light source according to claim 1, wherein the red light generating component comprises a red light fluorescent body which absorbs the blue light emitted by the blue light generating component and emits the red light by converting a wavelength of the blue light.

3. The light source according to claim 1, wherein the blue light generating component, the green light generating component, and the red light generating component are packaged into a whole, and the red light generating component is a red light fluorescent body which absorbs the blue light emitted by the blue light generating component and emits the red light by converting a wavelength of the blue light.

4. The light source according to claim 1, wherein the green light fluorescent body is either an aluminate system, a silicate system, a nitride system, a nitrogen oxide system, or a combination of any two thereof.

5. The light source according to claim 2, wherein the red light fluorescent body is either a nitride system, a silicate system, or a combination of the nitride system and the silicate system.

6. A light source, comprising:
at least one first light-emitting element;
at least one first additional light-emitting body, wherein the at least one first additional light-emitting body is configured to receive a portion of the light emitted by the at least one first light-emitting element and convert the portion of the light into light;

at least one second additional light-emitting body, wherein the at least one second additional light-emitting body is configured to receive a portion of the light emitted by the at least one first light-emitting element and convert the portion of the light into light; and light emitted by the light source is obtained by mixing the light emitted by the at least one first light-emitting element, the light emitted by the at least one first additional light-emitting body, and the light emitted by the at least one second additional light-emitting body, and color of the light emitted by the light source, wherein a difference between a first change rate and a second change rate is within a pre-determined range, wherein the first change rate is a change rate of spectral intensities of adjacent wavelengths of a luminescence spectrum of the light emitted by the light source, wherein the second change rate is a change rate of spectral intensities of adjacent wavelengths of a reference spectrum of solar light having a same lumen output as the light emitted by the light source.

7. The light source according to claim 6, wherein the at least one first additional light-emitting body is a green phosphor.

8. The light source according to claim 7, wherein the at least one first additional light-emitting body is either an aluminate green powder GaYAG or LuAG, a silicate green powder, or a salon green powder.

9. The light source according to claim 7, wherein the at least one second additional light-emitting body is a nitride red phosphor.

10. The light source according to claim 9, wherein the at least one second additional light-emitting body is CaAlSiN3:Eu.

11. The light source according to claim 10, wherein the at least one first additional light-emitting body is LuAG phosphor.

12. The light source according to claim 10, wherein the at least one first additional light-emitting body is GaYAG series aluminate green phosphor.

13. The light source according to claim 10, wherein the at least one first additional light-emitting body is a silicate green phosphor.

14. The light source according to claim 9, wherein the at least one second additional light-emitting body is Sr2Si5N8:Eu.

15. The light source module according to claim 14, wherein the at least one first additional light-emitting body is LuAG phosphor.

16. The light source module according to claim 14, wherein the at least one first additional light-emitting body is GaYAG series aluminate green phosphor.

17. The light source according to claim from 14, wherein the at least one first additional light-emitting body and the at least one second additional light-emitting body are mixed and included in an encapsulating adhesive.

18. The light source according to claim 17, wherein the at least one first light-emitting element is a blue light LED chip, and the encapsulating adhesive overlays the blue light LED chip.

19. An illumination device, comprising a light source comprising:

at least one first light-emitting element;

at least one first additional light-emitting body, wherein the at least one first additional light-emitting body is configured to receive a portion of the light emitted by the at least one first light-emitting element and convert the portion of the light into light;

at least one second additional light-emitting body, wherein the at least one second additional light-emitting body is configured to receive a portion of the light emitted by the at least one first light-emitting element and convert the portion of the light into light;

light emitted by the light source is obtained by mixing the light emitted by the at least one first light-emitting element, the light emitted by the at least one first additional light-emitting body, and the light emitted by the at least one second additional light-emitting body, and color of the light emitted by the light source; and a power supply module, connected with the light source to provide power required for working of the light source, wherein a difference between a first change rate and a second change rate is within a pre-determined range, wherein the first change rate is a change rate of spectral intensities of adjacent wavelengths of a luminescence spectrum of the light emitted by the light source, wherein the second change rate is a change rate of spectral intensities of adjacent wavelengths of a reference spectrum of solar light having a same lumen output as the light emitted by the light source.

20. The illumination device according to claim 19, wherein the illumination device further comprises a controller, and the controller is connected with the light source for adjusting the illumination light emitted by the light source.

* * * * *